United States Patent [19]

Uchida

[11] Patent Number: 4,920,391
[45] Date of Patent: Apr. 24, 1990

[54] SEMICONDUCTOR MEMORY DEVICE

[75] Inventor: Hidetsugu Uchida, Tokyo, Japan

[73] Assignee: Oki Electric Industry Co., Ltd., Tokyo, Japan

[21] Appl. No.: 332,584

[22] Filed: Apr. 3, 1989

[30] Foreign Application Priority Data

Apr. 5, 1988 [JP] Japan .................................. 63-82311

[51] Int. Cl.$^5$ ............................................ H01L 29/78
[52] U.S. Cl. .................................. 357/23.6; 357/23.4; 357/42; 357/54; 357/59
[58] Field of Search ................. 357/54, 42, 23.6, 23.7, 357/23.1, 23.4, 59 E, 45; 365/182, 186

[56] References Cited

U.S. PATENT DOCUMENTS 4,669,062  5/1987  Nakano .............................. 357/23.7
4,771,323  9/1988  Sasaki ................................. 357/23.6

FOREIGN PATENT DOCUMENTS 60-89975  5/1985  Japan ................................ 357/23.14

OTHER PUBLICATIONS

Sturm et al., "A Three-Dimensional Folded Dynamic RAM in Beam-Recrystalized Polysilicon", May 1984, *IEEE Electron Device Letters* vol. 5, pp. 151-153.
Nikkei Electronics, 10/7/85 m oo, 255-274; "Application of Polysilicon, Transistors to 3 Dimensional LSI Memories"; Malhi, et al.
Extended Abstracts of the 16th (1984) International Conference on Solid State Devices and Materials, Kobe, 1984, pp. 265-268; Shichijo, et al.

*Primary Examiner*—Andrew J. James
*Assistant Examiner*—Courtney A. Bowers
*Attorney, Agent, or Firm*—Edward D. Manzo

[57] ABSTRACT

In a semiconductor memory device formed on a semiconductor substrate (11), a first FET (21) is formed on a substrate. A first polysilicon film (13) serves as a gate electrode of this first FET (21). A second polysilicon film (16) is formed over the first polysilicon film (13), being separated by an insulating film (15). A third polysilicon film (20) is formed on the top and sides of the second polysilicon film (16). The third polysilicon film (20) has an impurity-doped region (19). A lower end (20a) of the third polysilicon film (20) is in contact with the first polysilicon film (13). The first, second and third polysilicon films (13, 16, 20) form a second FET (22), with the second polysilicon film (16) forming a gate electrode, and that part of the third polysilicon film (20) which is between the impurity-doped region (19) and the contacting end (20a) and adjacent to the second polysilicon film (16) forming a channel.

14 Claims, 9 Drawing Sheets 4,920,391

SEMICONDUCTOR MEMORY DEVICE

BACKGROUND OF THE INVENTION

The present invention relates to a semiconductor memory device, and more particularly to a gain cell having an internal gain for signal readout.

Examples of conventional gain cells are shown in Nikkei Electronics, Oct. 7, 1985, pages 255 to 274, and Extended Abstracts of the 16th (1984 International) Conference on Solid State Devices and Materials, Kobe, 1984, pp. 265–268.

The limitation of the prior art gain cells is inadequate size reduction. Accordingly, the primary object of the present invention is to achieve a further size reduction.

SUMMARY OF THE INVENTION

A memory cell having about the same area as a single transistor cell is provided. A transistor is formed to surround the word line over a sense transistor.

More specifically, a structure is built in and upon a semiconductor substrate 11. Forming a first FET 21, a first electrode 13 above the substrate serves as a gate electrode over source and drain regions in the substrate. A second electrode 16 is located over the first electrode 13, and preferably is not as wide as electrode 13, so that electrode 16 leaves two shoulders on the top surface of electrode 13. Electrode 16 preferably has insulation on its top, bottom and sides. In the preferred embodiment, the insulation beneath 16 is nitride, and the insulation on the top and sides is oxide. Thus, electrode 16 is separated by insulation 15 from electrode 13.

A third electrode is located on the top and sides of electrode 16, but separated therefrom by the insulation, preferably oxide 17, from electrode 16. Third electrode 20 has an impurity-doped region 19 which preferably is centrally located above electrode 16. Electrode 20 also includes side regions 18 having lower ends 20a. The lower ends 20a preferably contact the shoulders of first electrode 13. Preferably the conductivity of the impurity region 19 is the same type as first electrode 13, and opposite in type from side regions 18. As a result, a second FET 22 is formed by the first, second and third electrodes 13, 16, and 20, with the second electrode 16 forming its gate electrode. Side region 18, located between the impurity-doped region 19 and the contacting lower end 20a, forms a channel adjacent to the side of the second electrode 16.

Preferably a capacitor C1 is formed by electrodes 13 and 16, and a second capacitor C2 is formed by electrode 13 and the channel region formed below it.

Preferably the second electrode 16 forms a read/write line. Preferably the impurity region 19 of the third polysilicon film forms a write bit line. Preferably a contact is made to a source/drain region in the substrate to serve as a read bit line.

DETAILED DESCRIPTION OF THE EMBODIMENTS

Figure 1:
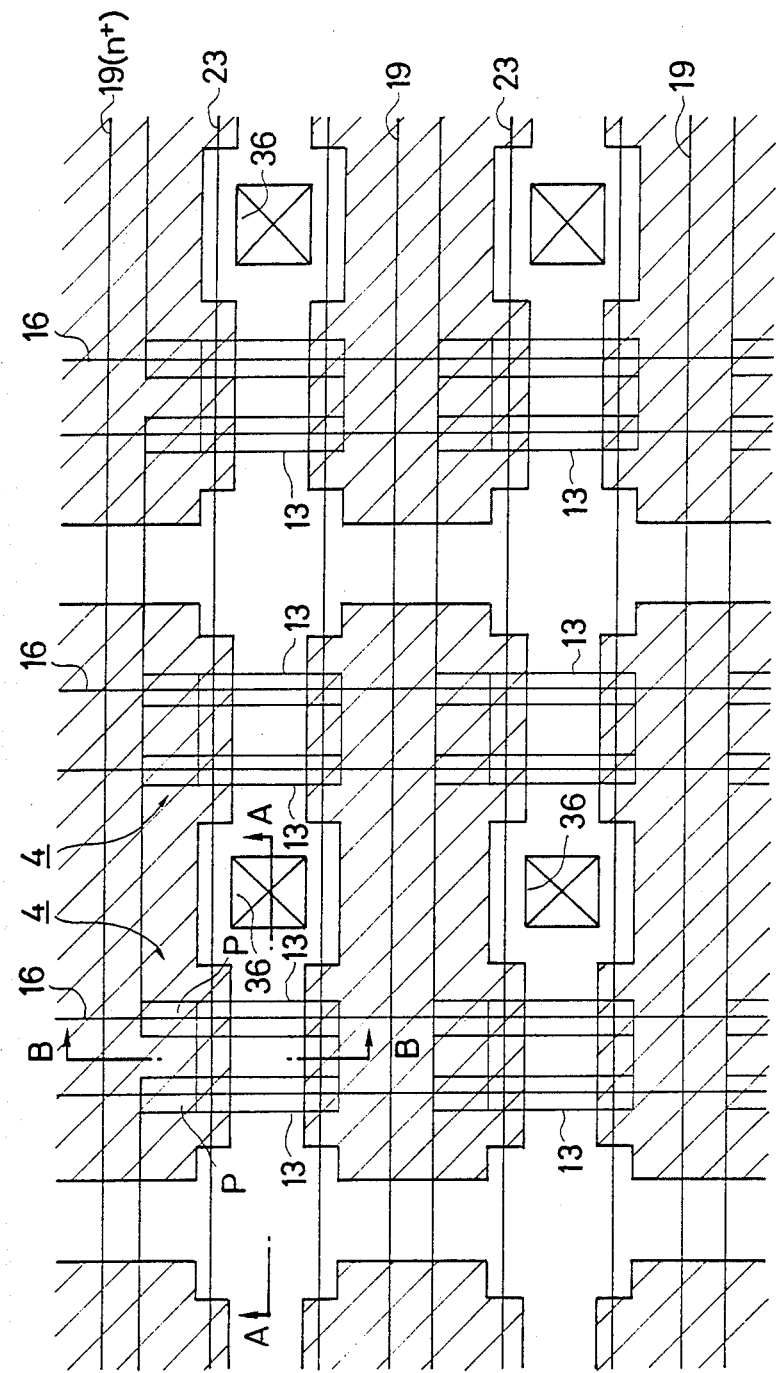
FIG. 1 is a plan view showing a part of a semiconductor memory device of an embodiment of the invention.
Figure 2:
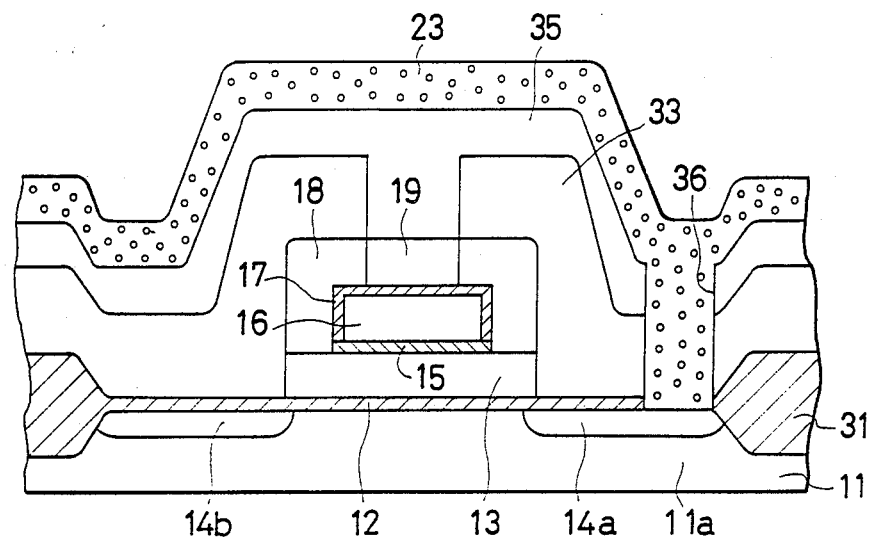
FIG. 2 is a sectional view along line A—A in FIG. 1.
Figure 3:
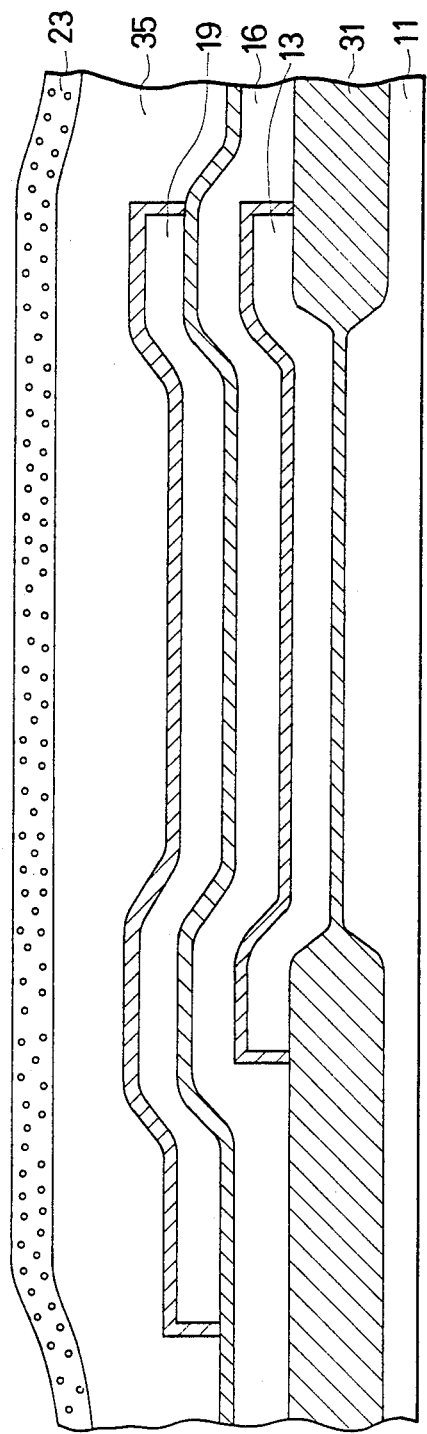
FIG. 3 is a sectional view along line B—B in FIG. 1.
Figure 4:
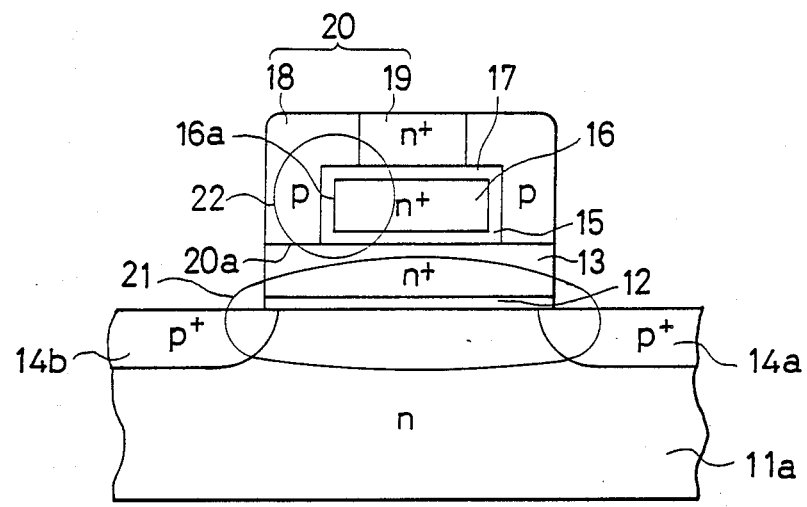
FIG. 4 is a sectional view showing details of the functional parts shown in FIG. 2.

FIG. 1 is a plan view showing a part of a semiconductor memory device of an embodiment of the invention.
FIG. 2 is a sectional view along line A—A in FIG. 1.
FIG. 3 is a sectional view along line B—B in FIG. 1.
FIG. 4 is a sectional view showing details of the functional parts shown in FIG. 2.

As illustrated, the semiconductor memory device is formed on an n-type silicon substrate 11, which is divided into active regions 11a insulated from each other by field oxide films 31. On each active region 11a, a gate oxide film 12 and a first polysilicon electrode (gate electrode) 13 of the $n^+$-type are formed. Source/drain regions 14a and 14b of the $p^+$-type are formed on the surface region of the active region 11a. A p-channel MOS FET 21 (FIG. 4) is comprised of the active region 11a with the source/drain regions 14a and 14b, the first polysilicon electrode 13. The first polysilicon electrode 13 serves as a gate electrode, and the part of the active region 11a under the first polysilicon electrode 13 forms a channel having both ends adjacent to the source/drain regions 14a and 14b. The p-channel MOS FET 21 serves as a sense transistor 21 (See FIG. 5).

Formed on the first polysilicon electrode (gate electrode) 13 is a second polysilicon electrode 16 of the $n^+$-type, being separated by a silicon nitride film 15. The second polysilicon electrode 16 is surrounded by a third polysilicon film 20 of the p-type, being separated by an oxide film 17. The third polysilicon film 20 has portions provided on the sides 16a of the second polysilicon electrode 16 with their lower ends 20a in contact with the first polysilicon electrode 13, and a portion provided over the second polysilicon electrode 16. Part of the third polysilicon electrode 20 over the second polysilicon electrode 16 has an $n^+$-type impurity-doped region 19. The remainder of the third polysilicon electrode 20 is a p-type impurity-doped region 18.

Figure 5:
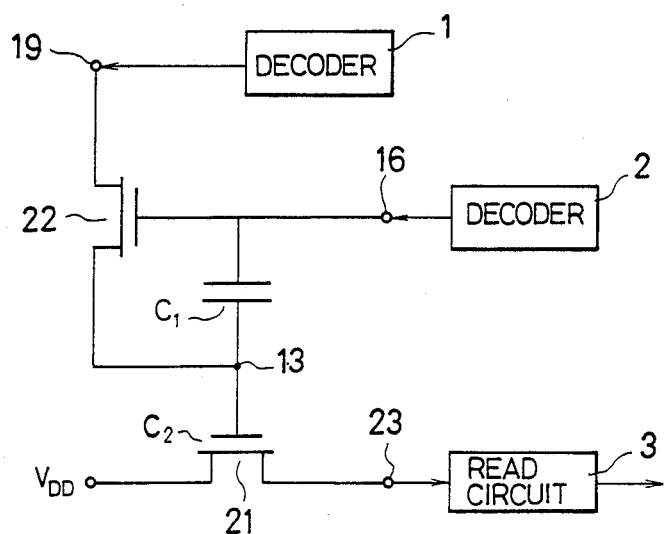
FIG. 5 is a circuit diagram showing an electrical circuit representation of the gain cell of FIG. 1 to FIG. 4.

The first polysilicon electrode 13, the p-type polysilicon region 18, the impurity-doped region 19, the second polysilicon electrode 16, and the insulating film 17 between the second and third polysilicon films 16 and 20 in combination form an n-channel polysilicon MOS FET 22 (see FIG. 5). More specifically, the impurity region 19 and the electrode 13 serve as source/drain regions, the polysilicon electrode 16 serve as a gate electrode, and parts of the p-type polysilicon region 18 adjacent to the second polysilicon electrode 16 serve as a channel. It can be said that the MOSFET 22 is a polysilicon transistor 22 formed around the read/write word line 16. These transistors 21 and 22 are interconnected as shown in the equivalent circuit diagram of FIG. 5.

The electrode 13 and the electrode 16 form a capacitor $C_1$, called an upper capacitor, and the electrode 13 serves as a data charge storage region or node as will be apparent from the following explanation. Another capacitor $C_2$, called a lower capacitor, is formed of the gate electrode 13 and the channel part of the transistor 21.

The region 19 is also connected to a write bit line, which is also denoted by the same reference numeral 19. The electrode 16 is also connected to and functions as part of a common read line, i.e., a read/write line, which is also denoted by the same reference numeral 16. The source/drain region 14a is connected via contact to a read bit line 23 formed of an aluminum conductor, not shown. The source/drain region 14b of each cell is contiguous to the corresponding source/drain region 14b of other cells, and some of them are connected via contact to a $V_{DD}$ line, not shown.

A plurality of identical memory cells 4 is formed on the semiconductor substrate 11. Each memory cell 4 comprises the active region 11a, the first and second FETs 21, 22, and the first and second capacitors $C_1$, and $C_2$. A plurality of read/write word lines 16 is connected to a decoder 2, a plurality of write bit lines 19 is connected to another decoder 1, and a plurality of read bit lines 23 is connected to a read circuit 3. Each of the read/write word lines 16 is connected to the second polysilicon films 16 of a plurality of the memory cells 4, each of the write bit lines 19 is connected to the impurity-doped regions 19 of a plurality of the memory cells 4, and each of the read bit lines 23 is connected to the first source/drain regions 14a of a plurality of memory cells 4.

The operation of the gain cell as explained above will now be described with reference to FIG. 6A, FIG. 6B, FIG. 6C, FIG. 7A, FIG. 7B and FIG. 7C. It is assumed that the ratio of the capacitance of the upper capacitor $C_1$ and the capacitance of the oxide film capacitor $C_2$ is 1:2, the threshold voltage Vtn of the n-channel transistor 22 is 2 V and the threshold voltage Vtp of the p-channel transistor 21 is −2 V.

The node $V_{DD}$ is kept at $V_{DD}$ = −5 V.

Figure 6A:
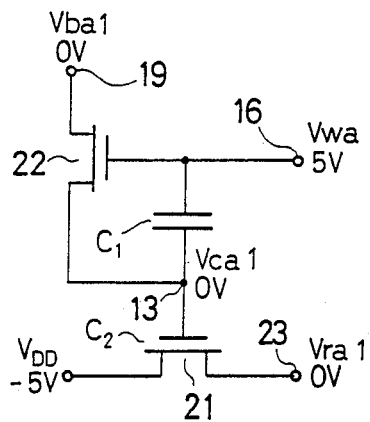
FIG. 6A, FIG. 6B and FIG. 6C show operation during writing "1", waiting with "1" stored, and reading "1".
Figure 6B:
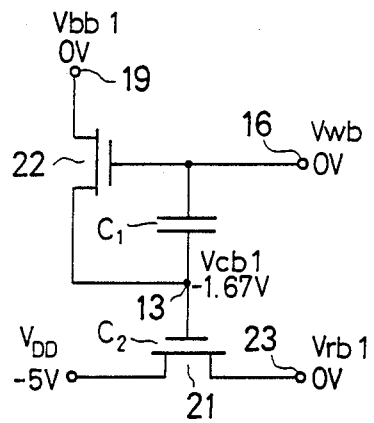
Figure 6C:
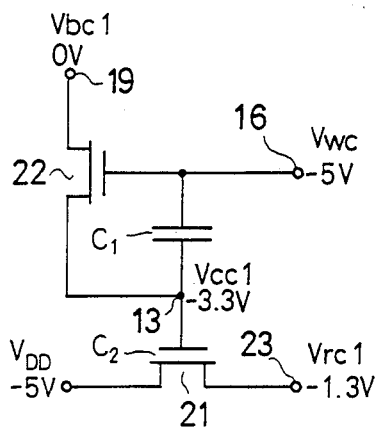
Figure 7A:
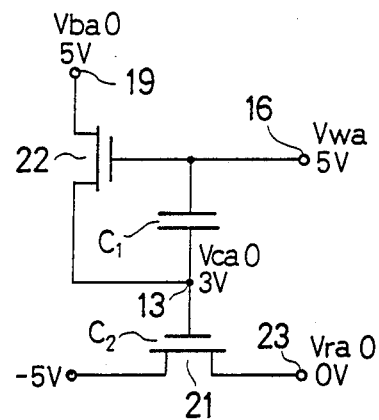
FIG. 7A, FIG. 7B and FIG. 7C show operation during writing "0", waiting with "0" stored, and reading "0".
Figure 7B:
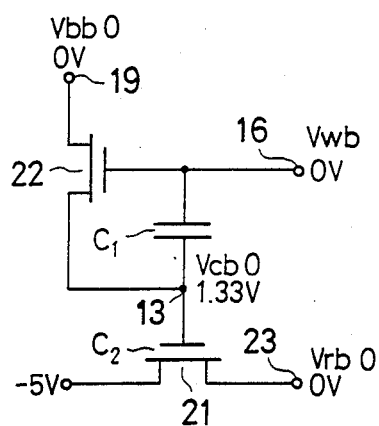
Figure 7C:
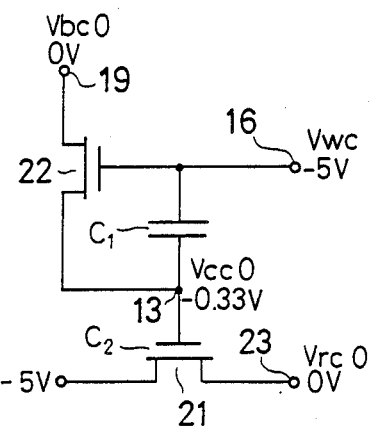

FIG. 6A, FIG. 6B and FIG. 6C, respectively show writing "1", waiting with "1" stored, and reading "1". FIG. 7A, FIG. 7B and FIG. 7C, respectively show writing "0", waiting with "0" stored, and reading "0".

During writing, the voltage Vwa applied to the read/write word line 16 is 5 V which sufficient to turn on the transistor 22. When writing "1" a first voltage Vba1 higher than the threshold voltage Vtn is applied to the write bit line 19. This causes a first charge Qc1 to be accumulated on the data charge storage node 13. When writing "0" a second voltage Vba0 lower than the threshold voltage Vtn is applied to the write bit line 19. This results in a second charge Qc0 to be left on the node 13. During waiting, the voltage Vwb applied to the read/write word line 16 is 0 V which is low enough to keep the transistor 22 off. The voltage applied to the write bit line 19 can be arbitrarily selected, and is for example 0 V. During reading, the voltage Vwc applied to the read/write word line 16 is −5 V which is so determined that the resultant re-distribution of the first charge Qc1 results in a voltage Vcb1 which causes the transistor 21 to be on, while the re-distribution of the second charge Qc0 results in a voltage Vcb0 which causes the transistor 21 to be off. When the transistor 21 is on, with its gate electrode at Vcb1, the voltage Vrc1 will be Vcb1-Vtp. When the transistor 21 is off, the voltage Vcb0 on the read bit line 23 will be at 0 V. Thus, the difference between the voltages Vrc1 and Vrc0 can be used for identifying the data that has been written in the cell.

Further explanation on the operation of the gain cell will now be given taking specific values of voltages as examples. As mentioned above, during writing Vwa is 5 V, higher than the threshold voltage Vtn (2 V), thereby turning on the transistor 22. For writing "1", Vba=0 V<Vtn so the voltage Vca1 on the node 13 becomes 0 V, which is higher than the threshold voltage Vtp, so the transistor 21 is off. The charge Qc stored on the node 13 is given by:

$$
\begin{aligned}
Qc1 &= -C_1 \cdot (Vwa - Vca) + C_2 \cdot Vca \\
&= -C_1 \cdot (5 - 0) + C_2 \cdot 0 \\
&= -5 \cdot C_1
\end{aligned}
$$

Since the transistor 21 is off, the voltage Vra1 on the read bit line 23 is at 0 V.

During waiting with "1" stored, the voltage Vcb1 on the data charge storage node becomes −1.67 V, because of the re-distribution of the charge between the capacitors $C_1$ and $C_2$, having the ratio $C_1/C_2 = \frac{1}{2}$. That is, the voltage after the charge re-distribution is given by:

$$
\begin{aligned}
Vcb1 &= Qc1/(C_1 + C_2) \\
&= -5 \cdot C_1/(C_1 + C_2) \\
&= -5 \cdot \frac{1}{3} \\
&= -1.67
\end{aligned}
$$

The transistor 22 is off because:

$$Vwb(=0\text{ V}) - Vcb1(=-1.67\text{ V}) = -1.67\text{ V} < Vtn(=2\text{ V})$$

The transistor 21 is also off because:

$$Vcb1(=-1.67\text{ V}) > Vtp(=-2\text{ V}).$$

Accordingly, the voltage Vrb1 on the read bit line 23 is 0 V.

During reading, the voltage Vwc on the read/write word line 16 becomes −5 V, so the voltage on the node 13 becomes −3.3 V because of the change in the voltage on the read/write word line 16 and attendant re-distribution of the charge between the capacitors. That is, the voltage after this charge re-distribution is given by:

$$
\begin{aligned}
Vcc1 &= (Qc1 + C_1 \cdot Vwc)/(C_1 + C_2) \\
&= \{-5 \cdot C_1 + C_1 \cdot (-5V)\}/(C_1 + C_2) \\
&= (-10 \cdot C_1)/(C_1 + C_2) \\
&= -10 \cdot \frac{1}{3} \\
&= -3.33
\end{aligned}
$$

Because $$Vwc(=-5\text{ V}) - Vcc1(=-3.33\text{ V}) = 1.67\text{ V} < Vtn(=2\text{ V})$$

the transistor 22 is off. Because $$Vcc1(=-3.33\text{ V}) < Vtp(=-2\text{ V})$$

the transistor 21 is on. Accordingly, the voltage Vrc1 on the read bit line 23 becomes −1.3 V {=−3.3 V−(−2 V)}.

During writing "0", the voltage Vba0 on the write bit line 19 is 5 V. As a result, the voltage Vca0 on the node 13 becomes 3 V because:

$$
\begin{aligned}
Vca0 &= Vwa - Vtn \\
&= 5V - 2V \\
&= 3V
\end{aligned}
$$

The transistor 21 is off because:

$$Vca0 = 3\ V > Vtp(=-2\ V)$$

Since the transistor 21 is off, the read bit line 23 is 0 V. The charge Qc0 on the node 13 is given by:

$$
\begin{aligned}
Qc0 &= -C_1(Vwa - Vca0) + C_2 \cdot Vca0 \\
&= -C_1(5V - 3V) + C_2 \cdot 3V \\
&= -C_1 \cdot 5V + (C_1 + C_2) \cdot 3V
\end{aligned}
$$

During waiting with "0" stored, the voltage Vcb0 on the node 13 is at 1.33 V because of the re-distribution of the charge between the capacitors. That is, the voltage Vcb0 after this re-distribution is given by:

$$
\begin{aligned}
Vcb0 &= Qc0/(C_1 + C_2) \\
&= \{-C_1 \cdot 5V + (C_1 + C_2)\,3V\}/(C_1 + C_2) \\
&= -5V \cdot \tfrac{1}{3} + 3V \\
&= -1.67V + 3V \\
&= 1.33V
\end{aligned}
$$

Because $$Vcb0(=1.33\ V) > Vtp(=-2\ V)$$

the transistor 21 is still off, so the voltage Vrb0 on the read bit line 23 still at 0 V.

During reading, the voltage on the data charge storage node 13 becomes −0.33 V because of the change in the voltage on the read/write word line 16 and attendant charge re-distribution between the capacitors. That is the voltage Vcc0 after this charge re-distribution is given by:

$$
\begin{aligned}
Vcc0 &= (Qc0 + C_1\,Vwc)/(C_1 + C_2) \\
&= [\{-C_1 \cdot 5V + (C_1 + C_2) \cdot 3V\} + \\
&\quad C_1 \cdot (-5V)]/(C_1 + C_2) \\
&= -5V \cdot \tfrac{1}{3} + 3V + -5V \cdot \tfrac{1}{3} \\
&= -0.33V
\end{aligned}
$$

Because $$Vwc(=-5\ V) - Vcc0(=-0.33\ V) = -4.67\ V < Vtn(=2\ V)$$

the transistor 22 is off. Because $$Vcc0(=-0.33\ V) > Vtp(=-2\ V)$$

the transistor 21 is off. Accordingly, the read bit line 23 is at 0 V.

Thus, the read bit line 23 is either −1.3 V or 0 V depending on whether the data that has been written is "1" or "0".

It will be appreciated from the above description that the following conditions must be satisfied for the proper operation.

Vwa > Vtn
Vca1 > Vtp
Vca0 > Vtp
Vwb − Vcb1 < Vtn
Vwb − Vcb0 < Vtn
Vcb1 > Vtp
Vcb0 > Vtp
Vwc − Vcc1 < Vtn
Vcc1 < Vtp
Vwc − Vcc0 < Vtn
Vcc0 > Vtp

Now the method of fabrication of the above described gain cell is described with reference to FIG. 8A to FIG. 8G.

Figure 8A:
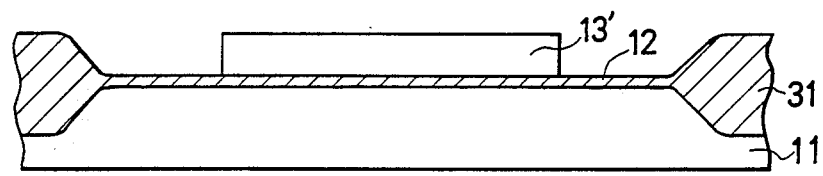
FIG. 8A to FIG. 8G show various steps of fabrication of the semiconductor memory.

First, an n-type silicon substrate 11 is prepared. On the surface of the silicon substrate 11, a field oxide film 31 of a thickness of 100 to 500 nm are selectively formed by wet oxidation, so that the substrate 11 is divided into active regions and field regions. On the surface of the active regions, a gate oxide film 12 (first gate insulation film) of a thickness of 10 to 30 nm is formed by dry oxidation. Next, on the entire surface of the substrate 11, a first polysilicon film 13′ is deposited to a thickness of 100 to 400 nm by LPCVD (liquid-phase chemical vapor deposition), and phosphorus (P) is diffused in the POCl3 atmosphere, or an n-type dopant such as phosphorus (P) or arsenic (As) is ion-implanted to obtain the polysilicon film 13′ of the n-type. This polysilicon film 13′ is patterned by photolithography. The result is shown in FIG. 8A.

Figure 8B:
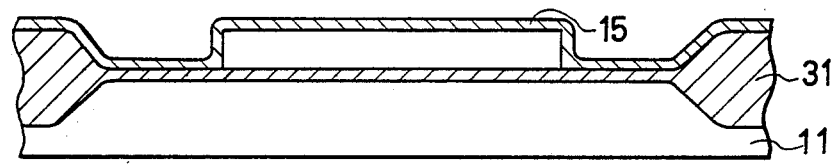

Then, on the n-type polysilicon film 13′, a silicon nitride film 15 is deposited to a thickness of 20 to 80 nm. The result is shown in FIG. 8B.

Figure 8C:
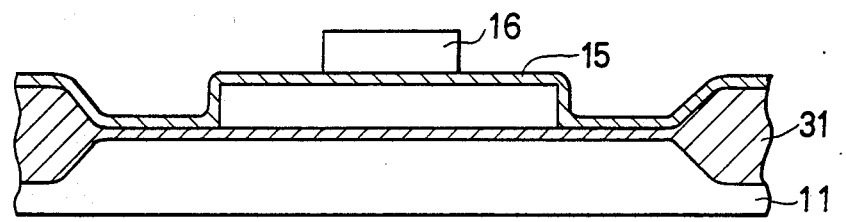

Then, a second polysilicon film 16 is deposited to a thickness of 100 to 400 nm in the manner similar to that which is used for the formation of the first polysilicon film 13′. That is, LPCVD and diffusion of phosphorus (P) in the POCl3 atmosphere, or ion-implantation of an n-type dopant such as phosphorus (P) or arsenic (As) is performed to obtain the second polysilicon film 16 of the n-type. Next, the n-type second polysilicon film 16 is patterned to form a second polysilicon electrode 16. The result is shown in FIG. 8C.

Figure 8D:
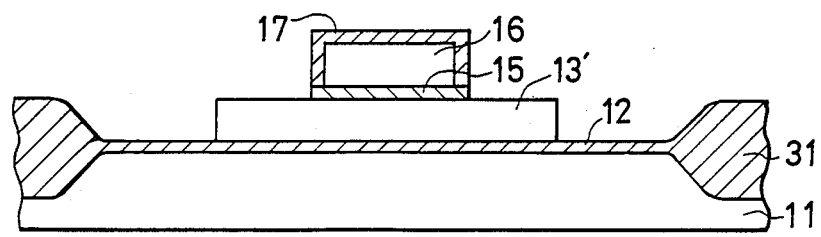

After that, oxidation is performed in an oxidizing atmosphere to form an oxide film (a second gate insulation film) 17 around the second polysilicon electrode 16. After that, the silicon nitride film 15 at areas other than below the second polysilicon electrode 16 is removed. The result is shown in FIG. 8D.

Figure 8E:
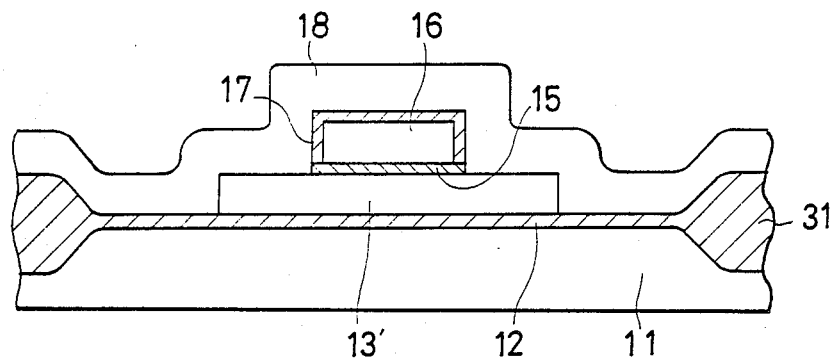

Then, a third polysilicon film 18 is deposited over the entire surface. Then, a p-type impurity (such as boron (B)) for the third polysilicon film 18 is ion-implanted to obtain the third polysilicon film 18 of the p-type. The result is shown in FIG. 8E.

Figure 8F:
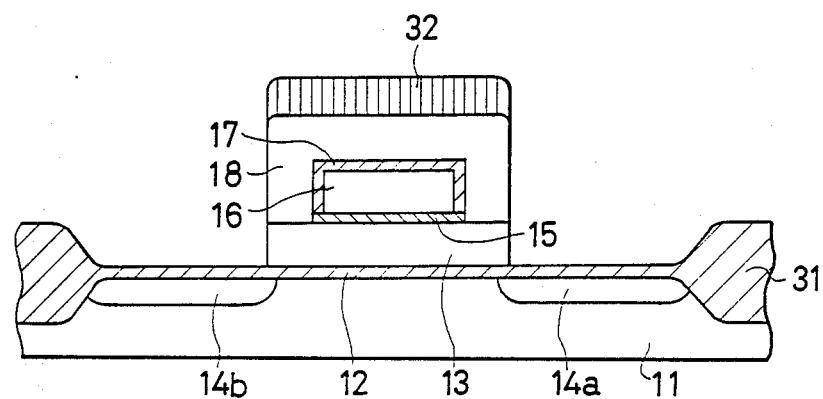

Then, a resist pattern 32 is formed on the third polysilicon film 18, and the third polysilicon film 18 is etched using the resist pattern 32 as a mask to leave the third polysilicon film 18 around the second polysilicon electrode 16, and the first polysilicon film 13′ is subsequently etched to form a first polysilicon electrode 13 below the third polysilicon film 18 and the second polysilicon electrode 16. The resist pattern 32 is then used as a mask during a subsequent ion-implantation of a p-type impurity such as boron (B) in the substrate 11 to form source/drain regions 14a and 14b. The result is shown in FIG. 8F.

Figure 8G:
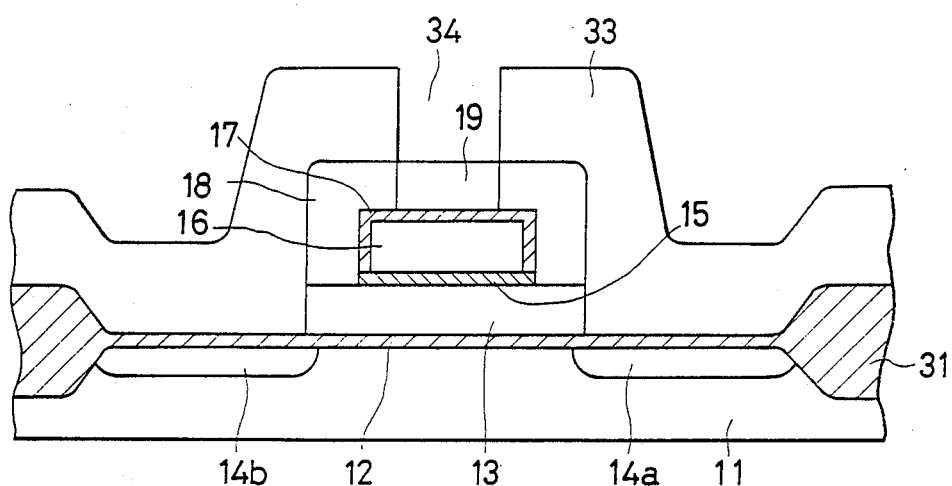

Then, a first intermediate insulating film 33, formed for example of PSG (phosphosilicate glass), BPSG (borophosphosilicate glass) or SiO$_2$, is deposited to a thickness of 100 to 600 nm, and openings 34 are formed in the first intermediate insulating film 33 to expose part of the upper surface of the third polysilicon film 18. Then, the exposed part is doped with an n-type impurity such as arsenic (As) or phosphorus (P) by diffusion or ion-implantation, and heat treatment for the purpose of activation is performed to form the n$^+$-type impurity-doped region 19 in the third polysilicon film 18. The result is shown in FIG. 8G.

Then, over the entire surface of the first intermediate insulating film 33, a second intermediate insulating film 35 of a similar material is deposited to a thickness of 100 to 600 nm, and contact holes 36 extending to the source/drain regions 14a are formed, and aluminum (Al) is vapor-deposited to a thickness of 300 to 900 nm and etched to obtain read bit line 23 extending through the contact holes 36 and connecting to the source/drain regions 14a. This completes the fabrication process and a device as shown in FIG. 1 to FIG. 4 is obtained.

As has been described, according to the invention, a single read/write word line serves as the read word line and write word line, and a polysilicon transistor is formed to surround the word line over the sense transistor, so the area occupied by a cell is about the same as the area for a single transistor, and the number of wiring conductors is reduced. Accordingly, the degree of integration can be improved. Moreover, the method of fabrication of the gain cell as described with reference to FIG. 8A to FIG. 8G is simpler than the prior art method.

What is claimed is:

1. A semiconductor memory device formed on a semiconductor substrate (11), comprising:
   an active region (11a) forming part of a semiconductor substrate (11);
   a gate insulating film (12) formed on the active region (11a);
   a first polysilicon film (13) of a first conductivity type formed over said gate insulating film (12);
   a second polysilicon film (16) formed over the first polysilicon film (13);
   an insulating film (17) formed on the side of said second polysilicon film (16) and over said second polysilicon film (16); and
   a third polysilicon film (20) formed on the side of said second polysilicon film (16) and over said second polysilicon film (16), being separated by the insulating film (17), and having a second conductivity type opposite to said first conductivity type, a contacting end (20a) of said third polysilicon film (20) being in contact with said first polysilicon film (13), part of said third polysilicon film formed over said second polysilicon film (16) having an impurity-doped region (19) of said first conductivity type;
   said active region (11a), said gate insulating film (12) and said first polysilicon film (13) forming a first FET (21);
   said first, second and third polysilicon films (13, 16, 20) forming a second FET (22), said second polysilicon film (16) forming a gate electrode; and that part of said third polysilicon film (20) which is between said impurity-doped region (19) and said contacting end (20a) and adjacent to said second polysilicon film (16) forming a channel of said second FET (22).

2. A semiconductor memory device according to claim 1, wherein
   a channel part of said first FET is formed under said first polysilicon film (13) to extend in a first direction along the surface of said active region (11a);
   said second polysilicon film (16) extends in a second direction intersecting said first direction and substantially in parallel with the surface of said active region (11a); and
   said channel of said second FET (22) is formed to extend in a third direction substantially normal to the surface of said active region (11a) and substantially in parallel with the side surface (16a) of said second polysilicon film (16).

3. A semiconductor memory device according to claim 1, wherein said first polysilicon film (13) is separated from said second polysilicon film (16) by a second insulating film (15) therebetween; and wherein said first and second polysilicon films (13, 16) and said second insulating film (15) form a first capacitor (C1).

4. A semiconductor memory device according to claim 1, wherein a channel part of said first FET (21) is formed under said first polysilicon film (13), and further comprising a first source/drain region (14a) provided adjacent a first end of the channel part under said gate insulating film (12), and a second source/drain region (14b) provided adjacent a second end of the channel part under said first gate insulating film (12).

5. A semiconductor memory device according to claim 4, wherein said first source/drain region (14a) is connected via a contact to a read bit line (23), and said second source/drain region is coupled to a power supply line (V$_{DD}$).

6. A semiconductor memory device according to claim 5, further comprising means (3) for discriminating the output produced on said read bit line to produce either a "1" signal or a "0" signal.

7. A semiconductor memory device according to claim 4, wherein said impurity-doped region (19) in said third polysilicon film (20) is connected to a write bit line (19).

8. A semiconductor memory device according to claim 7, further comprising means (1) for applying a data signal representing either "1" or "0" to said write bit line during writing of data.

9. A semiconductor memory device according to claim 7, wherein said data signal representing "1" is of such a value to cause a first charge to be accumulated on the first polysilicon film (13), while said data signal representing "0" is of such a value as to cause a second charge to be accumulated on the first polysilicon film (13), said first charge resulting in a voltage to cause said first FET (21) to be in one of its on and off states during reading, and said second charge resulting a voltage to cause said first FET (21) to be in the other of its on and off states during reading.

10. A semiconductor memory device according to claim 4, wherein said second polysilicon film (16) is connected to a read/write word line (16).

11. A semiconductor memory device according to claim 10, further comprising means (2) for applying a voltage to said read/write word line to turn on said second FET (22) during writing of data, and applying a voltage to said read/write word line of such a value not to turn on the second FET (22) during waiting and reading.

12. A semiconductor memory device according to claim 4, wherein
   said first source/drain region (14a) is connected via a contact to a read bit line (23), and said second source/drain region (14b) is coupled to a power supply line (V$_{DD}$);
   said impurity-doped region (19) in said third polysilicon film (20) is connected to a write bit line (19); and
   said second polysilicon film (16) is connected to a read/write word line (16).

13. A semiconductor memory device according to claim 12, further comprising:
   means (2) for applying a voltage to said read/write word line (16) to turn on said second FET (22) during writing of data, and applying a voltage to said read/write word line (16) of such a value not to turn on the second FET (22) during waiting and reading;
   means (1) for applying a data signal representing either "1" or "0" to said write bit line during writing of data; and means (3) for discriminating the output produced on said read bit line (23) to produce either a "1" signal or a "0" signal;
   wherein said data signal representing "1" is of such a value to cause a first charge to be accumulated on the first polysilicon film (13), while said data signal representing "0" is of such a value as to cause a second charge to be accumulated on the first polysilicon film (13), said first charge resulting in a voltage to cause said first FET (21) to be in one of its on and off states during reading, and said second charge resulting a voltage to cause said first FET (21) to be in the other of its on and off states during reading.

14. A semiconductor memory device according to claim 12, wherein a plurality of memory cells (4) are provided, each memory cell comprises said active region (11a), said first and second FETs (21, 22), and first and second capacitors (C$_1$, C$_2$) coupled between said FETs, a plurality of read/write word lines (16), a plurality of write bit lines (19), and a plurality of read bit lines (23) are provided, each of said read/write word lines (16) is connected to the second polysilicon films (16) of a plurality of the memory cells (4), each of said write bit lines (19) is connected to the impurity-doped regions (19) of a plurality of the memory cells (4), and each of said read bit lines (23) is connected to the first source/drain regions (14a) of a plurality of memory cells (4).

* * * * *